United States Patent
Schaefer

(10) Patent No.: US 9,007,076 B2
(45) Date of Patent: Apr. 14, 2015

(54) METHOD FOR MEASURING THE ELECTRICAL RESISTANCE OF A GLOW PLUG

(75) Inventor: Peter Schaefer, Knittlingen (DE)

(73) Assignee: BorgWarner BERU Systems GmbH, Ludwigsburg (DE)

( * ) Notice: Subject to any disclaimer, the term of this patent is extended or adjusted under 35 U.S.C. 154(b) by 338 days.

(21) Appl. No.: 13/455,384

(22) Filed: Apr. 25, 2012

(65) Prior Publication Data
US 2012/0274343 A1    Nov. 1, 2012

(30) Foreign Application Priority Data
Apr. 29, 2011  (DE) .................... 10 2011 018 941

(51) Int. Cl.
- *G01R 27/08* (2006.01)
- *G01R 27/14* (2006.01)
- *F02P 19/02* (2006.01)
- *F02D 35/02* (2006.01)

(52) U.S. Cl.
CPC .............. *G01R 27/14* (2013.01); *F02D 35/025* (2013.01); *F02P 19/025* (2013.01)

(58) Field of Classification Search
CPC ........ G01R 27/14; G01R 27/16; G01R 27/26; F02P 19/02; F02P 19/022; F02P 19/027; F02P 19/028

USPC .............................. 324/713; 123/145 A, 179.6
See application file for complete search history.

(56) References Cited

U.S. PATENT DOCUMENTS

| | | | | |
|---|---|---|---|---|
| 3,979,642 | A | * | 9/1976 | Cath et al. ...................... 361/56 |
| 4,694,145 | A | * | 9/1987 | Romstadt et al. ............. 219/497 |
| 2001/0045841 | A1 | * | 11/2001 | Kondo et al. ................. 324/765 |
| 2005/0237211 | A1 | * | 10/2005 | Sato et al. ..................... 340/635 |
| 2008/0156091 | A1 | * | 7/2008 | Hickman et al. ............. 73/304 R |
| 2009/0269901 | A1 | * | 10/2009 | Naito ............................. 438/393 |

FOREIGN PATENT DOCUMENTS

| | | | |
|---|---|---|---|
| DE | 197 18 750 | A1 | 11/1997 |
| DE | 19718750 | A1 * | 11/1997 |
| DE | 10 2007 009 105 | B4 | 4/2009 |

* cited by examiner

*Primary Examiner* — Tung X Nguyen
*Assistant Examiner* — Son Le
(74) *Attorney, Agent, or Firm* — Hackler Daghighian & Martino

(57) ABSTRACT

The invention relates to a method for measuring the electrical resistance of a glow plug, wherein a test current is set by closed-loop control to a constant value using a constant-current source, and is directed through the plug. A value of the electrical resistance of the glow plug is determined by evaluating a feedback signal of the constant-current source.

9 Claims, 1 Drawing Sheet

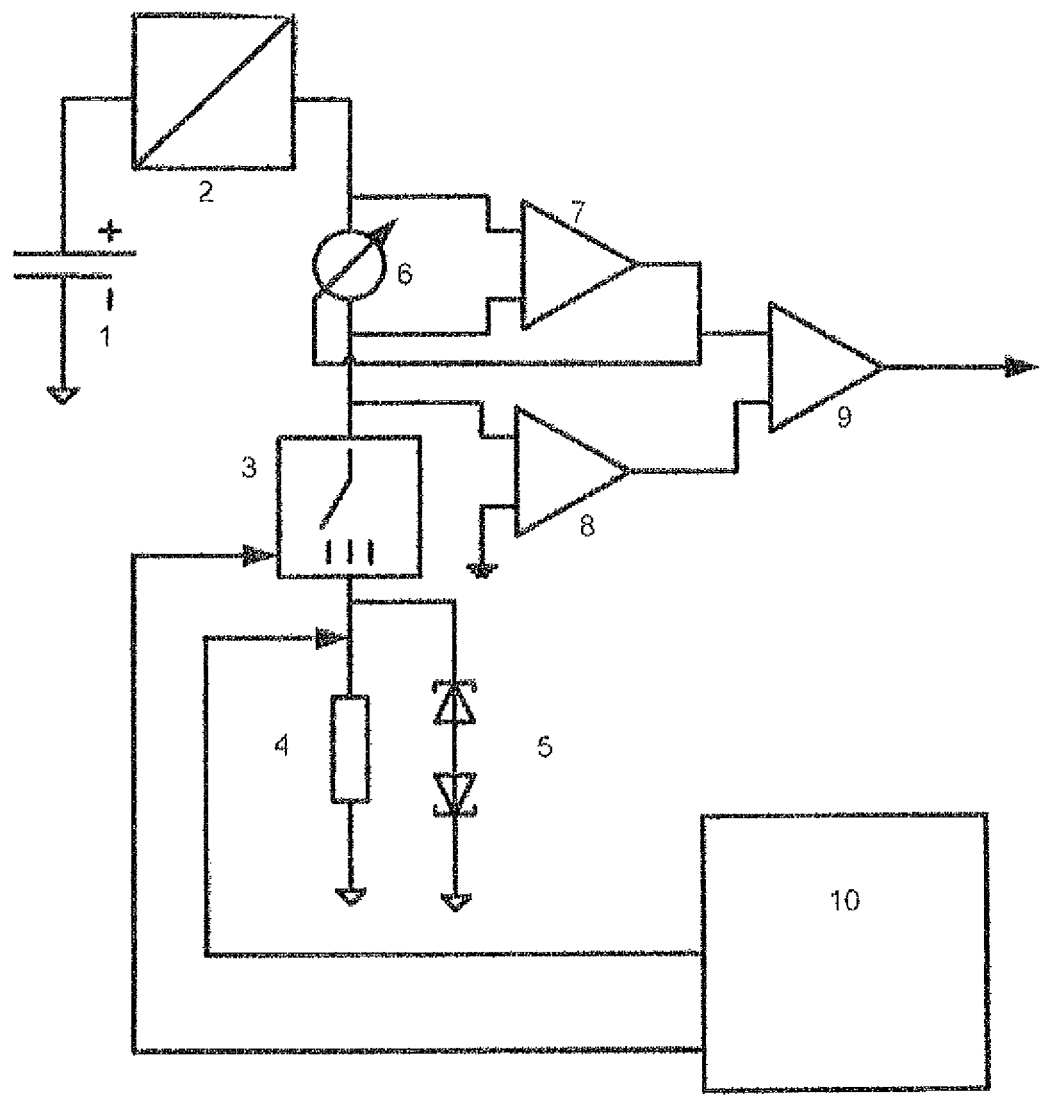

METHOD FOR MEASURING THE ELECTRICAL RESISTANCE OF A GLOW PLUG

The invention is based on a method as known from DE 10 2007 009 105 B4.

The temperature of a glow plug can be determined from the electrical resistance thereof. Precise measurement of resistance is therefore highly significant for the efficient temperature regulation of a glow plug. In addition, by evaluating the course of resistance of a glow plug, it is also possible to monitor the fuel combustion taking place in the combustion chamber of an engine in a cyclic manner. On the basis of the course of resistance of a glow plug, it is therefore also possible to determine parameters that can be used to improve engine control.

A problem addressed by the present invention is therefore that of demonstrating a way to reliably determine the electrical resistance of a glow plug with minimal complexity while the engine of a motor vehicle is running.

Advantageous refinements of the invention are the subject matter of dependent claims.

SUMMARY OF THE INVENTION

In a method according to the invention for measuring the electrical resistance of a glow plug, a test current is adjusted by closed-loop control to a constant value using a constant-current source, and is directed through the glow plug. For said control, the constant-current source generates a feedback signal that induces an increase in the electrical resistance of the constant-current source if the test current increases and induces a decrease in the electrical resistance of the constant-current source if the test current decreases. In this manner, every change in the test current is counteracted and, therefore, the test current is held at a constant value by closed-loop control.

According to the invention, the feedback signal of the constant-current source is evaluated in order to determine a value of the electrical resistance of the glow plug. An advantage of the method according to the invention, therefore, is that the feedback signal, which is present anyway given a constant-current source, is used to measure the resistance of the glow plug, thereby making it possible to keep the component-related complexity to a minimum. In addition, the feedback signal of the constant-current source is negatively affected by interfering signals to a lesser extent than is a direct measurement of the plug resistance.

The value of the feedback signal of the constant-current source per se can even be used as a measure of the electrical resistance, in particular when the feedback signal is a voltage signal. A voltage signal that is measured between the constant-current source and the glow plug with respect to a reference potential, e. g. with respect to ground potential, may also be used in the evaluation of the feedback signal. This means that the feedback signal is evaluated by linking it to the voltage signal that is measured between the constant-current source and the glow plug. In this manner the influence of interfering signals can be reduced further, and the accuracy of the measurement can be improved, in particular when the feedback signal and/or the measurement signal are filtered.

The linking of the feedback signal to the voltage signal may take place by way of a differential amplifier to which the feedback signal is fed, as is the voltage signal that is measured between the constant-current source and the glow plug.

The feedback signal can be filtered in order to further reduce the influence of interfering signals. In particular, filters can be connected upstream of the two inputs of the above-mentioned differential amplifier.

The constant-current source can be in the form of a current regulating diode, for example. Current regulating diodes are field effect transistors comprising a resistor. In the case of current regulating diodes, the resistor is typically connected in series to the source terminal of the field effect transistor. The connection side of the field effect transistor on which the resistor is disposed, that is, the source terminal, for example, is fed back to the gate terminal. It is therefore possible to tap the feedback signal used in the method according to the invention at the gate of the field effect transistor. The field effect transistor is preferably a JFET.

The constant-current source can also be in the form of a more complex circuit comprising a plurality of transistors or operational amplifiers. Regardless of the embodiment of the constant-current source, it always delivers a feedback signal, which counteracts an increase or decrease of the current. According to the invention, this feedback signal is used to measure the resistance of the glow plug.

BRIEF DESCRIPTION OF THE DRAWINGS

Further details and advantages of the invention are explained using an embodiment, with reference to the attached drawing. Shown are:

FIG. 1 a schematic block diagram of a circuit for supplying a glow plug and for measuring the resistance thereof.

DETAILED DESCRIPTION

The block diagram in FIG. 1 schematically depicts only a single glow plug 4, which is supplied with pulse-width modulated voltage by a glow plug control device 10 for heating. The remaining glow plugs of the engine, which is not depicted, are likewise supplied with pulse-width modulated voltage by way of the glow plug control device 10. Overvoltage protection 5 is connected in parallel to the glow plugs 4.

By way of a multiplexer 3, always at most one glow plug 4 is connected to a constant-current source 6, which generates a constant test current. The multiplexer 3 is controlled by the glow plug control device 10, and therefore the constant-current source 6 is decoupled from the pertinent glow plug 4 during the voltage pulse that is applied to a glow plug 4 for heating. The constant-current source 6 is therefore connected to a plug 4 only in the pauses between the current pulses applied to a plug 4 for heating. The multiplexer 3 ensures that the individual glow plugs 4 of an engine are successively connected to the constant-current source 6.

The test current generated by the constant-current source 6 is set by closed-loop control to a constant value using a feedback signal, and is directed through the plug 4. The feedback signal is evaluated in order to determine a value of the electrical resistance of the glow plug 4.

To this end, in the example embodiment presented, the feedback signal is fed to an amplifier 9 for evaluation. The electrical resistance of the glow plug is then determined from the output signal of the amplifier 9, which may then be filtered. The amplifier 9 may be a differential amplifier, to the other input of which a measurement signal—which is delivered by a differential amplifier 8—is applied. One input of amplifier 8 is at ground. The other input of amplifier 8 taps a voltage between the constant-current source 6 and the multiplexer 3. To improve the evaluation, further elements such as filters can be added to the circuit, in particular to reduce the influence of interfering signals. Filters can be disposed upstream or downstream of the differential amplifiers 8, 9.

In the example embodiment shown, the feedback signal of the constant-current source 6 is generated using a differential amplifier 7. The voltage at the first input of differential amplifier 7 is the voltage that is present upstream of the constant-current source 6. The voltage that is present downstream of the constant-current source 6 is fed to the other input of the differential amplifier 7. The feedback signal can also be generated without such an amplifier 7, however, for instance by using a current regulating diode as the constant-current source 6.

A supply voltage, which is generated from a vehicle battery 1 using a DCDC converter 2, is fed to the constant-current source 6.

REFERENCE NUMERALS

1 Vehicle battery
2 DCDC converter
3 Multiplexer
4 Glow plug
5 Overvoltage protection
6 Constant-current source
7 Differential amplifier
8 Differential amplifier
9 Amplifier
10 Glow plug control device

What is claimed is:

1. A method for determining the electrical resistance of a glow plug, wherein a test current is set by closed-loop control to a constant value using a constant-current source and is directed through a glow plug circuit to the glow plug, and wherein a feedback signal of the constant-current source is evaluated in order to determine a value of the electrical resistance of the glow plug, where the feedback signal goes through a feedback signal circuit connected to the constant-current source but where the feedback signal circuit does not contain the glow plug, wherein the feedback signal is evaluated by linking it to a voltage signal that is measured between the constant-current source and the glow plug with respect to a reference potential where the reference potential is a ground potential, and wherein the linking is done by a differential amplifier to which the feedback signal and the voltage signal measured between the constant-current source and the glow plug are fed.

2. The method according to claim 1, wherein the feedback signal is a voltage signal.

3. The method according to claim 1, wherein the feedback signal is generated by measuring an electrical voltage upstream and downstream of the constant-current source.

4. The method according to claim 1, wherein the feedback signal is generated using a differential amplifier to which a voltage that is tapped upstream of the constant-current source and a voltage that is tapped downstream of the constant-current source are fed.

5. The method according to claim 1, wherein a supply voltage generated from a vehicle system voltage by a DCDC converter is supplied to the constant-current source.

6. The method according to claim 1, wherein the constant-current source is a current regulating diode.

7. The method according to claim 1, wherein the glow plug is heated by way of pulse-width modulated current pulses, wherein the constant-current source is decoupled from the glow plug.

8. A method for determining the resistance a glow plug, the method comprising:
   providing a constant-value current by means of a constant-value current source coupled to a feedback signal loop that does not contain the glow plug;
   sending the constant-value current as a test current through the glow plug;
   evaluating a feedback signal that is provided by the feedback signal loop where the feedback signal is different from the test current; and
   determining a value of an electrical resistance of the glow plug from the evaluation of the feedback signal;
   wherein the feedback signal is evaluated by linking it to a voltage signal that is measured between the constant-current source and the glow plug with respect to a reference potential where the reference potential is a ground potential;
   wherein the linking is done by a differential amplifier to which the feedback signal and the voltage signal measured between the constant-current source and the glow plug are fed.

9. A method for controlling a glow plug, the method comprising:
   providing a constant-value current by means of a constant-value current source coupled to a feedback signal loop that does not contain the glow plug;
   sending the constant-value current as a test current through the glow plug;
   evaluating a feedback signal that is provided by the feedback signal loop where the feedback signal is different from the test current;
   determining a value of an electrical resistance of the glow plug from the evaluation of the feedback signal; and
   stabilizing the constant-value current from the constant-value current source by closed-loop control using the feedback signal;
   wherein the feedback signal is evaluated by linking it to a voltage signal that is measured between the constant-current source and the glow plug with respect to a reference potential where the reference potential is a ground potential;
   wherein the linking is done by a differential amplifier to which the feedback signal and the voltage signal measured between the constant-current source and the glow plug are fed.

* * * * *